US008410582B2

(12) United States Patent
Bandyopadhyay et al.

(10) Patent No.: US 8,410,582 B2
(45) Date of Patent: Apr. 2, 2013

(54) 3D POLYSILICON DIODE WITH LOW CONTACT RESISTANCE AND METHOD FOR FORMING SAME

(75) Inventors: Abhijit Bandyopadhyay, San Jose, CA (US); Kun Hou, Milpitas, CA (US); Steven Maxwell, Synnyvale, CA (US)

(73) Assignee: SanDisk 3D LLC, Milpitas, CA (US)

(*) Notice: Subject to any disclaimer, the term of this patent is extended or adjusted under 35 U.S.C. 154(b) by 0 days.

(21) Appl. No.: 13/479,093

(22) Filed: May 23, 2012

(65) Prior Publication Data
US 2012/0228579 A1 Sep. 13, 2012

Related U.S. Application Data

(62) Division of application No. 12/562,079, filed on Sep. 17, 2009, now Pat. No. 8,207,064.

(51) Int. Cl.
*H01L 29/66* (2006.01)

(52) U.S. Cl. .................................................. 257/656

(58) Field of Classification Search .............. 257/655, 257/656
See application file for complete search history.

(56) References Cited

U.S. PATENT DOCUMENTS

| 4,886,764 | A | 12/1989 | Miller et al. | |
|---|---|---|---|---|
| 7,176,064 | B2* | 2/2007 | Herner | 438/131 |
| 7,405,465 | B2 | 7/2008 | Herner | |
| 7,648,896 | B2 | 1/2010 | Herner | |
| 2003/0219971 | A1* | 11/2003 | Cabral et al. | 438/622 |
| 2006/0087005 | A1 | 4/2006 | Herner | |
| 2006/0292301 | A1 | 12/2006 | Herner | |
| 2007/0069217 | A1 | 3/2007 | Herner | |
| 2007/0087508 | A1 | 4/2007 | Herner | |
| 2007/0190722 | A1 | 8/2007 | Herner | |
| 2008/0308903 | A1 | 12/2008 | Petti et al. | |
| 2008/0311722 | A1 | 12/2008 | Petti et al. | |
| 2011/0062557 | A1 | 3/2011 | Bandyopadhyay et al. | |

OTHER PUBLICATIONS

Gannavaram et al., "Low Temperature (≦800° C.) Recessed Junction Selective Silicon-Germanium Source/Drain Technology for sub-70 nm CMOS", IEEE 2000, pp. 18.3.1-18.3.4, 4 pages.

Herner et al., "Polysilicon Memory Switching: Electrothermal-Induced Order", IEEE Transactions on Electron Devices, vol. 53, No. 9, Sep. 2006, 8 pages.

Herner et al., "Vertical p-i-n Polysilicon Diode With Antifuse for Stackable Field-Programmable ROM", IEEE Electron Device Letters, vol. 25, No. 5, May 2004, pp. 271-273, 3 pages.

(Continued)

*Primary Examiner* — Bradley K Smith
(74) *Attorney, Agent, or Firm* — Vierra Magen Marcus LLP

(57) ABSTRACT

A semiconductor p-i-n diode and method for forming the same are described herein. In one aspect, a SiGe region is formed between a region doped to have one conductivity (either p+ or n+) and an electrical contact to the p-i-n diode. The SiGe region may serve to lower the contact resistance, which may increase the forward bias current. The doped region extends below the SiGe region such that it is between the SiGe region and an intrinsic region of the diode. The p-i-n diode may be formed from silicon. The doped region below the SiGe region may serve to keep the reverse bias current from increasing as result of the added SiGe region. In one embodiment, the SiGe is formed such that the forward bias current of an up-pointing p-i-n diode in a memory array substantially matches the forward bias current of a down-pointing p-i-n diode which may achieve better switching results when these diodes are used with the R/W material in a 3D memory array.

18 Claims, 14 Drawing Sheets

OTHER PUBLICATIONS

Hirose, F., et al., "Junction Surface Treatment for High-Breakdown-Voltage SiGe/Si Diodes", Electrochemical and Solid-State Letters, Mar. 2006, pp. G73-G76, vol. 9, No. 3, Department of Electrical Engineering, Yamagata University, Japan, 4 pages.

Hirose, F., et al., "New SiGe Bipolar Transistors and p-i-n Diodes for Power Switching", IEEE Transactions on Electron Devices, Oct. 2001, pp. 2417-2420, vol. 48, No. 10, 4 pages.

International Search Report and Written Opinion of the International Searching Authority dated Jan. 17, 2011, Patent Cooperation Treaty, PCT Application No. PCT/US2010/047957, filed Sep. 7, 2010, 8 pages.

Ozturk et al., "A New Junction Technology Based on Selective CVD of SiGe Alloys for CMOS Technology Nodes Beyond 30 nm," publication date unknown, 1 page.

Stoica, T., et al., "Electroluminescence of Strained SiGe/Si Selectively Grown Above the Critical Thickness for Plastic Relaxation", Journal of Applied Physics, Mar. 15, 1998, pp. 3367-3373, vol. 83, No. 6, 7 pages.

Wu et al., "High Temperature Formed SiGe P-MOSFET's with Good Device Characteristics", IEEE Electron Device Letters, vol. 21, No. 7 Jul. 2000, pp. 350-352, 3 pages.

Office Action Restriction dated Apr. 1, 2011, U.S. Appl. No. 12/562,079, filed Sep. 17, 2009, 6 pages.

Response to Office Action Restriction dated Apr. 18, 2011, U.S. Appl. No. 12/562,079, filed Sep. 17, 2009, 7 pages.

Office Action dated Jul. 19, 2011, U.S. Appl. No. 12/562,079, filed Sep. 17, 2009, 14 pages.

Response to Office Action dated Oct. 17, 2011, U.S. Appl. No. 12/562,079, filed Sep. 17, 2009, 11 pages.

Final Office Action dated Dec. 15, 2011, U.S. Appl. No. 12/562,079, filed Sep. 17, 2009, 14 pages.

Response to Final Office Action dated Feb. 17, 2012, U.S. Appl. No. 12/562,079, filed Sep. 17, 2009, 8 pages.

Notice of Allowance and Fee(s) Due dated Mar. 1, 2012, U.S. Appl. No. 12/562,079, filed Sep. 17, 2009, 5 pages.

Response to Written Opinion dated Nov. 1, 2012, European Patent Application No. 10760496.9, filed Sep. 7, 2010, 11 pages.

\* cited by examiner

| TiN 230 | TiN 230 | TiN 230 |
| Silicide forming material | Silicide forming material | Silicide forming material |
| SiGe 233 | SiGe 233 | SiGe 233 |
| p+ Polysilicon 246 | p+ Polysilicon 246 | p+ Polysilicon 246 |
| Intrinsic Polysilicon 244 | Intrinsic Polysilicon 244 | Intrinsic Polysilicon 244 |
| n+ Polysilicon 242 | n+ Polysilicon 242 | n+ Polysilicon 242 |
| TiN 213 | TiN 213 | TiN 213 |

Bottom Conductor 206a

Substrate 1002

*Fig. 10F*

3D POLYSILICON DIODE WITH LOW CONTACT RESISTANCE AND METHOD FOR FORMING SAME

CLAIM OF PRIORITY

This application is a divisional application of U.S. patent application Ser. No. 12/562,079, entitled "3D POLYSILICON DIODE WITH LOW CONTACT RESISTANCE AND METHOD FOR FORMING SAME," filed Sep. 17, 2009, now U.S. Pat. No. 8,207,064, which is incorporated herein by reference in its entirety.

BACKGROUND

1. Field

The present invention relates to technology for data storage.

2. Description of the Related Art

Semiconductor-based p-i-n diodes are known in the art. These diodes are referred to as p-i-n devices because they include a region that is heavily doped with a p-type conductor (p+ region), an intrinsic region, and a region that is heavily doped with an n-type conductor (n+ region). The intrinsic region is not intentionally doped, but may have a low level of n-type and/or p-type impurities. The p-i-n diode may be formed with materials such as silicon, germanium, silicon germanium, etc. Suitable dopants can be used in the p+ region and the n+ region.

Semiconductor-based p-i-n diodes have a variety of uses. One proposed usage is a memory cell. Published U.S. Patent Application 2005/0052915 titled, "Nonvolatile Memory Cell without a Dielectric Antifuse having High- and Low-impedance States," filed on Sep. 29, 2004 describes a p-i-n diode that has at least two resistance states such that it may be used as a memory cell. As formed, the p-i-n diode may be in a high-resistance state. Application of a programming voltage may change the resistance to a low resistance state. Published U.S. Patent Application 2005/0226067, "Nonvolatile Memory Cell Operating by Increasing Order in Polycrystalline Semiconductor Material," which was filed Jun. 8, 2005, also describes p-i-n diodes that may be used for memory cells. Both said patent applications are hereby incorporated by reference herein for all purposes.

Semiconductor-based p-i-n diodes have also been proposed for use as a steering element in a memory array that uses elements having reversible resistance-switching behavior as the memory cells. When used as a steering element, the p-i-n diode helps to control current flow in order to control which memory cells are programmed and read. A variety of materials that show reversible resistance-switching behavior may be used as memory cells. These materials include chalcogenides, carbon polymers, perovskites, and certain metal oxides and nitrides. Specifically, there are metal oxides and nitrides which include only one metal and exhibit reliable resistance switching behavior. This group includes, for example, NiO, $Nb_2O_5$, $TiO_2$, $HfO_2$, $Al_2O_3$, $MgO_x$, $CrO_2$, VO, BN, and AlN, as described by Pagnia and Sotnick in "Bistable Switching in Electroformed Metal-Insulator-Metal Device," Phys. Stat. Sol. (A) 108, 11-65 (1988). A layer of one of these materials may be formed in an initial state, for example a relatively low-resistance state. Upon application of sufficient voltage, the material switches to a stable high-resistance state. This resistance switching may be reversible such that subsequent application of an appropriate current or voltage can serve to return the resistance-switching material to a stable low-resistance state. This conversion can be repeated many times. For some materials, the initial state is high-resistance rather than low-resistance.

In order to function well, it is desirable for the p-i-n diode to have a high forward bias current and a low reverse bias current. The diode's rectification ratio is defined as the ratio of the forward bias current to the reverse bias current at a particular bias voltage (positive and negative). A high rectification ratio is desirable. However, techniques that provide for a higher forward bias current tend to undesirably increase the reverse bias current.

It is also desirable for the forward bias currents of all of the diodes in the memory array to be approximately the same. However, there may be variations between forward bias currents of diodes in different parts of the memory array. For some conventional memory arrays these variations are systematic. The memory array is usually formed above a substrate with some diodes pointing upwards from the substrate and others pointing downwards. By pointing upwards, it is meant that the direction of the forward bias current is away from the substrate. For some conventional memory arrays, the forward bias currents of the up-pointing diodes may consistently be higher or lower than the forward bias currents of the down-pointing diodes. These differences in forward bias currents can present problems when using the diodes to control which memory cells are programmed and read. Other problems can also arise due to the differences in currents.

BRIEF DESCRIPTION OF THE DRAWINGS

FIGS. 10A-10G depict results after various steps of a process of forming p-i-n diodes.

DETAILED DESCRIPTION

Figure 1A:
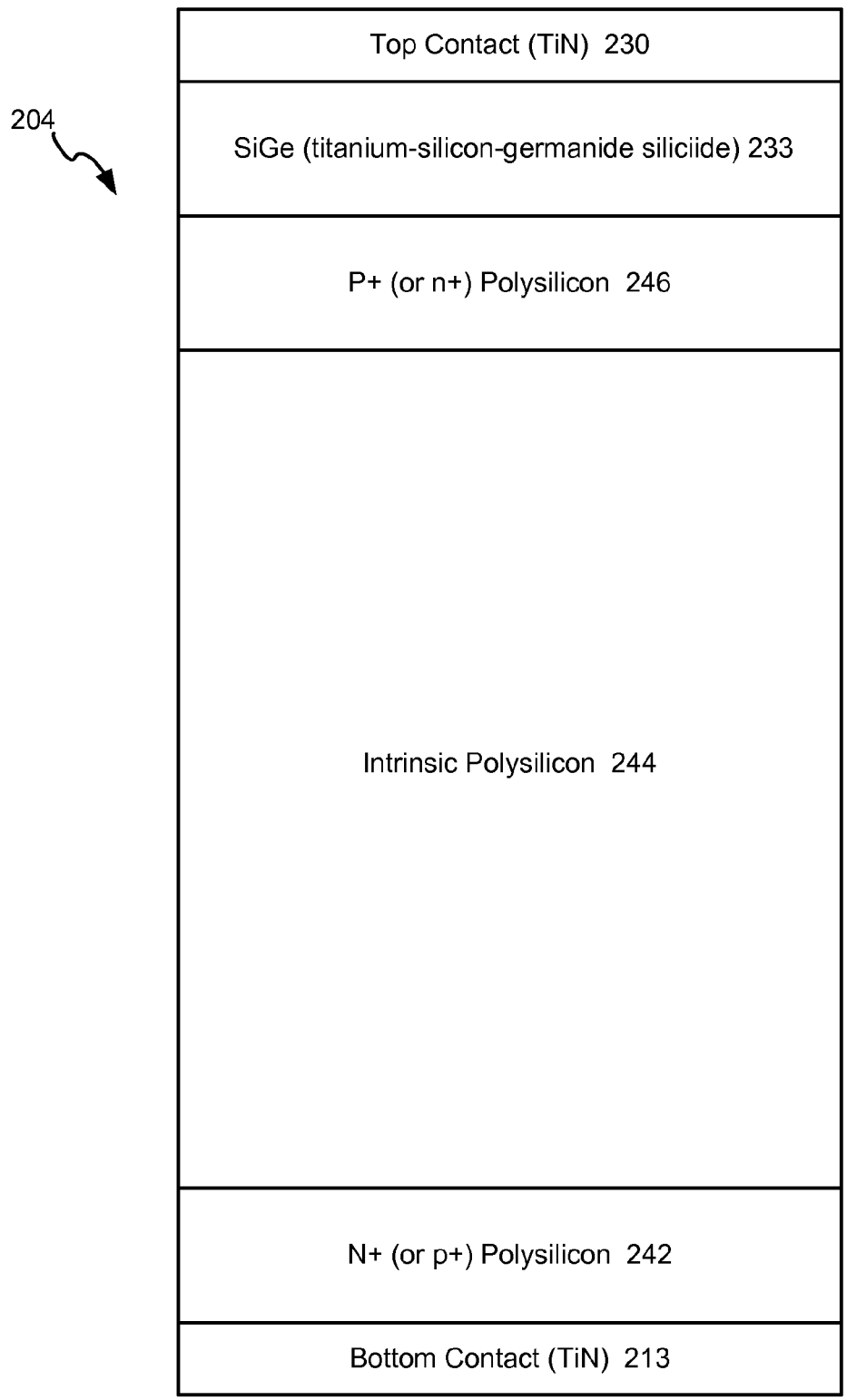
FIG. 1A is one embodiment of a p-i-n diode.

A semiconductor p-i-n diode and method for forming the same are described herein. Memory arrays having p-i-n diodes and techniques for forming memory arrays having p-i-n diodes are disclosed herein. Techniques disclosed herein provide for a low contact resistance between the p-i-n diode and a top contact, which provides for a good forward bias current. Techniques also provide for a relatively low reverse bias current. Thus, the p-i-n diode has a good rectification ratio. Moreover, techniques disclosed herein provide for forming p-i-n diodes in a memory array such that the forward bias currents substantially match. Specifically, the forward bias currents of up-pointing diodes can be made to substantially match those of down pointing diodes, which may achieve better switching results when used in a 3-D memory array. Having the electrical performance of the up- and down-pointing diodes match can obtain better switching yields of the programmed bits at different levels of the memory array.

In one embodiment, a SiGe region is formed between an n+ region and a contact to the p-i-n diode. The SiGe region may serve to lower the resistance between the contact and the p-i-n diode, which may increase the forward bias current. The n+ region extends below the SiGe region such that it is between the SiGe region and the intrinsic region of the diode. The n+ region below the SiGe region may serve to keep the reverse bias current from increasing as result of the added SiGe region. In one embodiment, an SiGe region is formed between a p+ region and a contact to the p-i-n diode. The p+ region extends below the SiGe region such that it is between the SiGe region and the intrinsic region.

In one embodiment, some p-i-n diodes in a memory array have an SiGe region between a heavily doped region and a contact, whereas others do not. For example, up-pointing diodes may have the SiGe region, whereas down-pointing diodes do not. Alternatively, down-pointing diodes may have the SiGe region, whereas up-pointing diodes do not. The SiGe regions may be formed such that the forward bias current of up-pointing p-i-n diodes substantially matches the forward bias current of down-pointing p-i-n diodes.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element or layer is referred to as being "formed over," or "formed above" another element or layer, it can be directly or indirectly formed over or above the other element or layer. That is, intervening elements or layers may be present. In contrast, when an element or layer is referred to as being "directly formed on," to another element, there are no intervening elements or layers present. Other words used to describe the relationship between elements or layers should be interpreted in a like fashion (e.g., "in contact with" versus "in direct contact with," "between," versus "directly between," "adjacent," versus "directly adjacent," etc.).

FIG. 1A is one embodiment of a p-i-n diode 204. The p-i-n diode 204 is shown connected between a bottom conductive contact 213 and a top conductive contact 230, each of which may be formed from TiN or another conductor. The diode 204 has heavily doped regions 242, 246 on either side of intrinsic polycrystalline silicon (herein "polysilicon") region 244. Region 242 is polysilicon that is heavily doped with an n-type impurity. An example range of thickness for this region 242 is 100 Å-200 Å as deposited; however, region 242 may be thicker or thinner. Examples of n-type impurities include, but are not limited to, phosphorus and arsenic. Region 246 is polysilicon that is heavily doped with a p-type impurity. An example range of thickness for this region 246 is 100 Å-200 Å; however, region 246 may be thicker or thinner. Examples of p-type impurities include, but are not limited to, Boron and $BF_2$. An example range of thickness for intrinsic polysilicon region 244 is 1500 Å-1800 Å; however, region 244 may be thicker or thinner. Note that in some embodiments, the doping of regions 242 and 246 can be reversed. That is, region 242 may be doped with a p-type impurity and region 246 may be doped with an n-type impurity. However, for purposes of discussion region 246 will be referred to as a p-doped region.

Above the p+ region 246 is a SiGe region 233 that is at least partially silicided. The SiGe region 233 may provide a low electrical resistance to the top contact 230, therefore increasing forward bias current. In one embodiment, SiGe region 233 is initially formed from $Si_{0.8}Ge_{0.2}$; however, other relative concentrations of silicon and germanium may be used. After depositing a silicide forming material (e.g., titanium) and the top contact 230, thermal annealing may be performed such that SiGe region 233 is at least partially silicided. For example, a titanium-silicon-germanide is formed from at least a portion of the SiGe. Some of the SiGe in region 233 may remain un-silicided. Herein, when referring to region 233 it will be understood that the SiGe may be at least partially silicided with a silicide forming material including, but not limited to, titanium, cobalt, tantalum, platinum, tungsten or nickel, An example range of initial thickness of the deposited SiGe is 100 Å-200 Å; however, region 233 may be thicker or thinner. In one embodiment, a thin capping layer 231 of intrinsic polysilicon is deposited above the SiGe region 233 (not depicted in FIG. 1A). An example thickness for capping layer is 10-30 Å; however, the capping layer may be thicker or thinner.

It is desirable to have a good electrical resistance between the p-i-n diode 204 and top contact 230. A low electrical resistance can lead to a good forward bias current. That is, if the electrical resistance between p-i-n diode 204 and the conductive layers above the diode 204 is low, the forward bias current tends to be greater. However some conventional techniques that have been used to increase the forward bias current also tend to increase the reverse bias current, which is undesirable.

Note that in FIG. 1A that the p+ region 246 is below the SiGe region 233. Thus, there is an interface of SiGe to p+ polysilicon and an interface of p+ polysilicon to intrinsic polysilicon. Having the p+ region below the SiGe region 233 may serve to keep the reverse bias current relatively small. That is, without the p+ region 246 (or alternately an n+ region) below the SiGe region 233 the effect of the SiGe region 233 may be to increase both the forward bias current and the reverse bias current. The depth of the p+ region 246 may be selected to achieve desired diode characteristics. Note that increasing the depth of the p+ region 246 could decrease the thickness of the intrinsic region 244. If the thickness of the intrinsic region 244 is made shorter, the reverse current may increase.

Figure 1B:
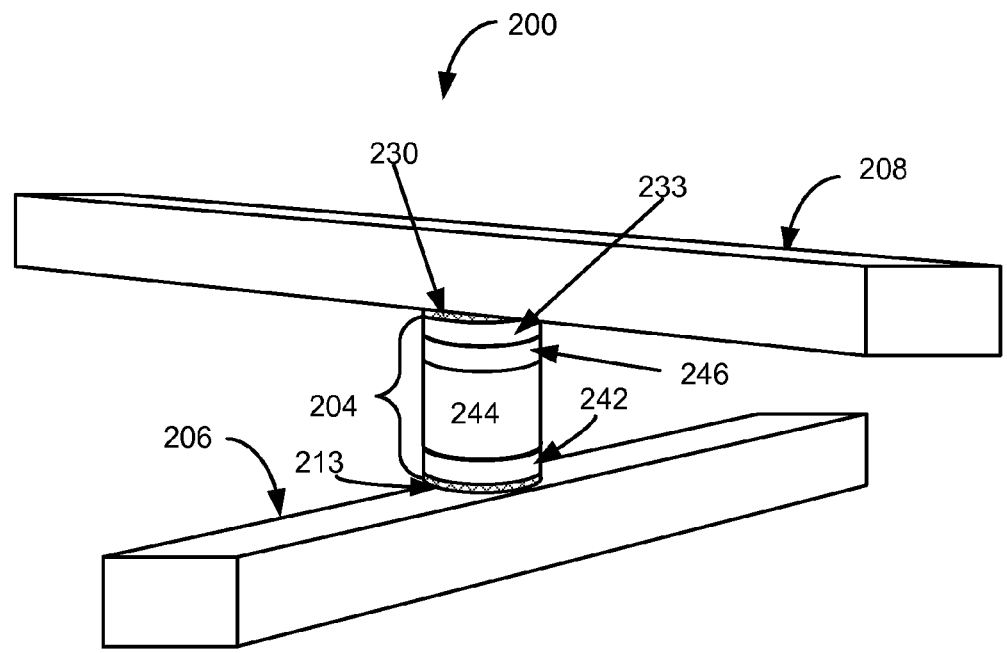
FIG. 1B is a simplified perspective view of one embodiment of a p-i-n diode used as a memory cell.

In some embodiments, the semiconductor p-i-n diode 204 is used as a memory cell in a memory array. FIG. 1B is a simplified perspective view of one embodiment of a p-i-n diode 204 used as a memory cell 200. The p-i-n diode 204 may have at least two resistance states such that it may be used as a memory cell. Further details of using p-i-n diodes as memory cells may be found in Published U.S. Patent Application 2005/0052915 and Published U.S. Patent Application 2005/0226067, both of which were previously incorporated by reference herein for all purposes. The p-i-n diode 204 may be formed of polysilicon.

Bottom contact 213, which may be TiN or another conductor, resides between the p-i-n diode 204 and the bottom conductor 206. A top contact 230, which may be TiN or another conductor, resides between the p-i-n diode 204 and the top conductor 208. The p-i-n diode 204 includes a heavily doped region of one type of conductivity 242 (e.g., either n+ or p+), an intrinsic region 244, a SiGe region 233 (which may be at least partially silicided), and a heavily doped region of another type of conductivity 246 (e.g., either p+ or n+). As an example, region 242 may be doped with an n-type dopant (e.g., phosphorus, arsenic or antimony) and region 246 doped with an p-type dopant (e.g., boron or $BF_2$). Alternatively, region 242 may be doped with a p-type dopant and region 246 doped with an n-type dopant. The intrinsic region 244 is not intentionally doped. However, there may be some small amount of impurities in the intrinsic region 244. In some embodiments, a barrier layer resides between the bottom contact 213 and the bottom conductor 206. A barrier layer is not always used. The SiGe region 233 itself may be doped or undoped.

Conductors 206 and 208 may be formed from any suitable conductive material such as tungsten, any appropriate metal, heavily doped semiconductor material, a conductive silicide, a conductive silicide-germanide, a conductive germanide, or the like. In the embodiment of FIG. 1B, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

Figure 1C:
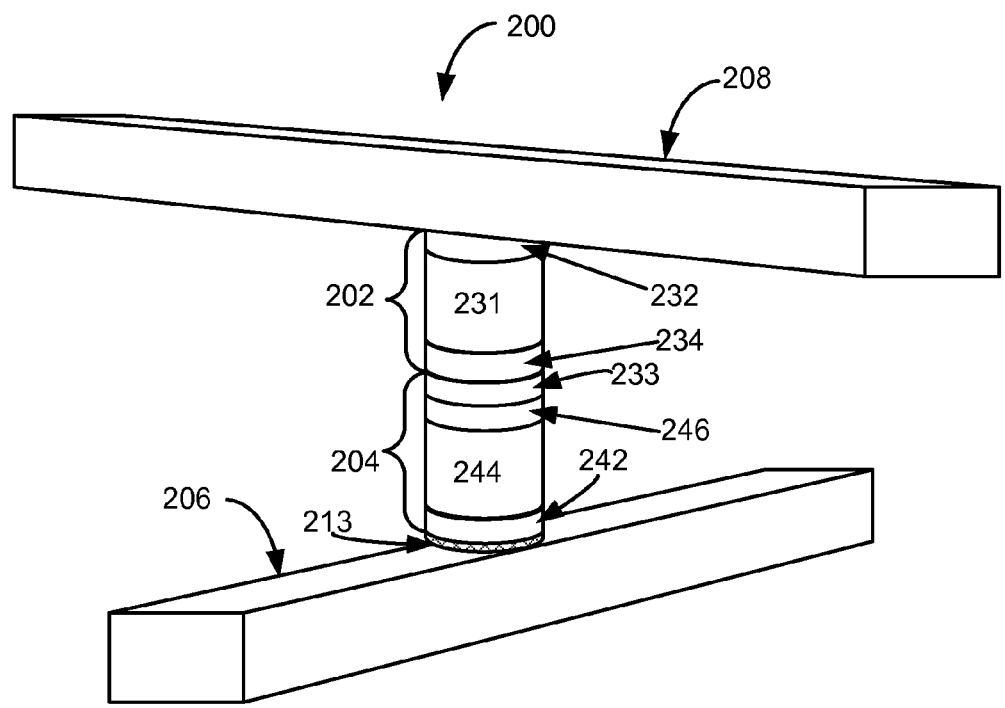
FIG. 1C is a simplified perspective view of one embodiment of a memory cell with a p-i-n diode used as a steering element.

In some embodiments, the p-i-n diode 204 is used as a steering device in a memory array in which data is stored in reversible resistance-switching elements. FIG. 1C is a simplified perspective view of one embodiment of a memory cell 200 which includes a reversible resistance-switching element 202 coupled in series with a p-i-n diode 204 (used as a steering element) between a first conductor 206 and a second conductor 208.

Reversible resistance-switching element 202 includes reversible resistivity-switching material 231 having a resistivity that may be reversibly switched between two or more states. For example, the reversible resistivity-switching material may be in an initial high-resistivity state upon fabrication that is switchable to a low-resistivity state upon application of a first physical signal. For example, the device may switch states in response to application of a first amount of energy, charge, heat, voltage, current or other phenomena. Application of a second amount of energy, charge, heat, voltage, current or other phenomena may return the reversible resistivity-switching material to the high-resistivity state. Alternatively, the reversible resistance-switching element 231 may be in an initial low-resistance state upon fabrication that is reversibly switchable to a high-resistance state upon application of the appropriate energy, charge, heat, voltage, current or other phenomena. When used in a memory cell, one resistance state may represent a binary "0" while another resistance state may represent a binary "1." However, more than two data/resistance states may be used.

In one embodiment, the process of switching the resistance from the high-resistivity state to the low-resistivity state is referred to as SETTING the reversible resistance-switching element 202. The process of switching the resistance from the low-resistivity state to the high-resistivity state is referred to as RESETTING the reversible resistance-switching element 202. The high-resistivity state may be associated with binary data "0" and the low-resistivity state is associated with binary data "1." In other embodiments, SETTING and RESETTING and/or the data encoding can be reversed.

Reversible resistance-switching element 202 includes electrodes 232 and 234. Electrode 232 is positioned between reversible resistivity-switching material 231 and conductor 208. In one embodiment, electrode 232 is made of platinum. Electrode 234 is positioned between reversible resistivity-switching material 231 and diode 204. In one embodiment, electrode 234 is made of titanium nitride, tungsten nitride or the like.

In some embodiments, reversible resistance-switching material 231 may be formed from a metal oxide. Various different metal oxides can be used. In one example, nickel oxide is used. More information about materials for reversible resistivity-switching materials and operation of memory cells employing reversible resistance-switching materials are described, for example, in U.S. Patent Application Publication 2006/0250836, filed on May 9, 2005, entitled "Rewriteable Memory Cell Comprising a Diode and a Resistance-Switching Material," and United States Patent Application Publication 2009/0001343, filed on Jun. 29, 2007, entitled "Memory Cell that Employs a Selectively Deposited Reversible Resistance Switching Element and Methods of Forming the Same," both of which are hereby incorporated herein by reference in their entirety for all purposes.

The p-i-n diode (steering element) 204 allows the memory cell 200 to be used as part of a two or three dimensional memory array and data may be written to and/or read from the memory cell 200 without affecting the state of other memory cells in the array. Diode 204 includes any suitable diode such as a vertical polycrystalline p-n or p-i-n diode, whether upward pointing with an n-region above a p-region of the diode or downward pointing with a p-region above an n-region of the diode.

For example, the diode 204 may include a heavily doped n+ polysilicon region 242, a lightly doped or an intrinsic polysilicon region 244 above the n+ polysilicon region 242, a SiGe region 233 (which may be at least partially silicided) above the intrinsic region 244, and a heavily doped p+ polysilicon region 246 above the intrinsic region 244. The SiGe region 233 provides low electrical resistance to electrode (or contact) 234 (which may be TiN). It will be understood that the locations of the n+ and p+ regions may be reversed.

Conductors 206 and 208 may include any suitable conductive material such as tungsten, any appropriate metal, heavily doped semiconductor material, a conductive silicide, a conductive silicide-germanide, a conductive germanide, or the like. In the embodiment of FIG. 1C, conductors 206 and 208 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 206 and 208 to improve device performance and/or aid in device fabrication.

Conductors 206 and 208 are typically orthogonal to one another and form array terminal lines for accessing an array of memory cells 200. The array terminal lines (also called array lines) at one layer may be termed word lines or X-lines. The array lines at a vertically adjacent layer may be termed bit lines or Y-lines. A memory cell 200 can be formed at the projected intersection of each word line and each bit line, and connected between the respective intersecting word line and bit line as shown for the formation of memory cell 200. A three-dimensional memory array which has at least two levels of memory cells 200 (i.e., two memory planes) may utilize more than one layer of word lines and/or more than one layer of bit lines. A monolithic three dimensional memory array is one in which multiple memory levels are formed above a single substrate, such as a wafer, with no intervening substrates. One example of which is described in U.S. Pat. No. 6,992,349, filed on May 20, 2004, and titled "Rail Stack Array Of Charge Storage Devices And Method Of Making Same," which is hereby incorporated herein by reference for all purposes.

While the reversible resistance-switching element 202 is shown as being positioned above the diode 204 in FIG. 1C, it will be understood that in alternative embodiments, the reversible resistance-switching element 202 may be positioned below the diode 204.

Figure 2:
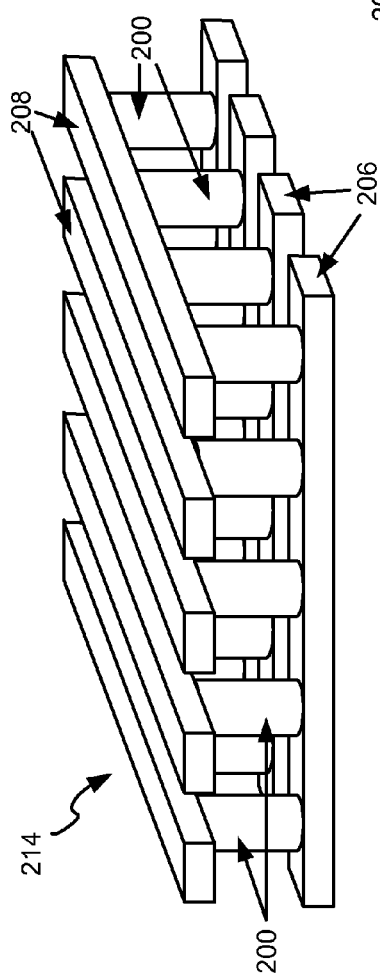
FIG. 2 is a simplified perspective view of a portion of a first memory level formed from a plurality of the memory cells.

FIG. 2 is a simplified perspective view of a portion of a first memory level 214 formed from a plurality of the memory cells 200. Memory cells 200 from either FIG. 1B or 1C may be used. For simplicity, some elements are not separately shown in FIG. 2. For example, the reversible resistance-switching element 202 (for those embodiments that use element 202), the p-i-n diode 204, bottom contact 213, and top contact 230 are not separately shown. The memory array 214 is a "cross-point" array including a plurality of bit lines (second conductors 208) and word lines (first conductors 206) to which multiple memory cells are coupled (as shown). Other memory array configurations may be used, as may multiple levels of memory.

Figure 3:
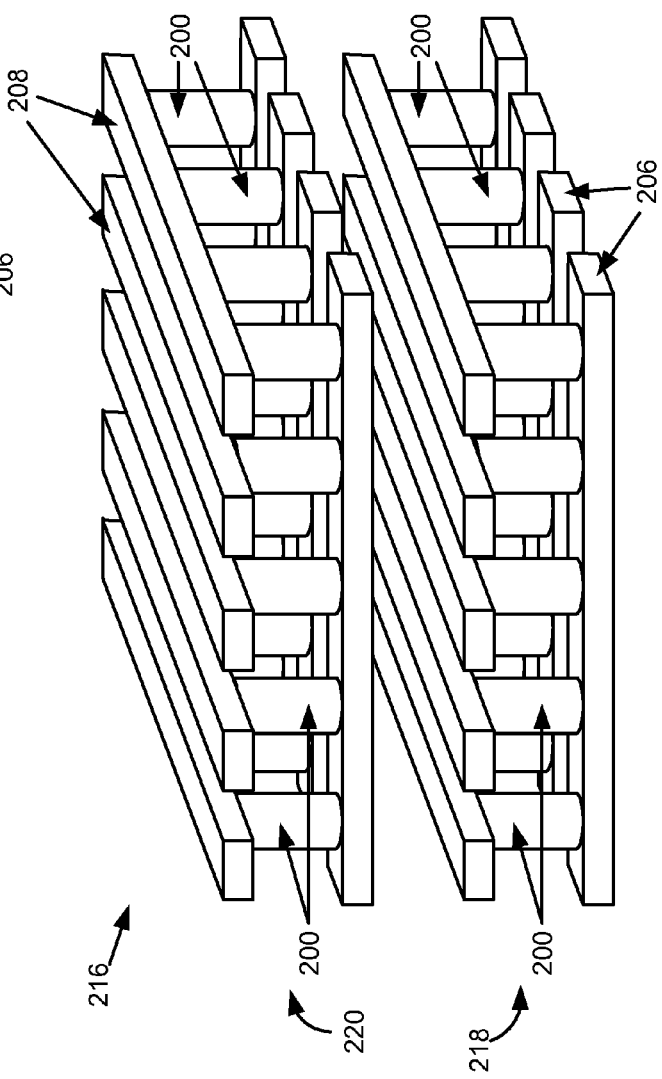
FIG. 3 is a simplified perspective view of a portion of a three dimensional memory array.

FIG. 3 is a simplified perspective view of a portion of a monolithic three dimensional array 216 that includes a first memory level 218 positioned below a second memory level 220. In the embodiment of FIG. 3, each memory level 218 and 220 includes a plurality of memory cells 200 in a cross-point array. It will be understood that additional layers (e.g., an inter-level dielectric) may be present between the first and second memory levels 218 and 220, but are not shown in FIG. 3 for simplicity. Other memory array configurations may be used, as may additional levels of memory. In the embodiment of FIG. 3, all diodes may "point" in the same direction, such as upward or downward depending on whether p-i-n diodes having a p-doped region on the bottom or top of the diode are employed, simplifying diode fabrication. However, up-pointing and down-pointing diodes may be used at different levels.

Figure 4:
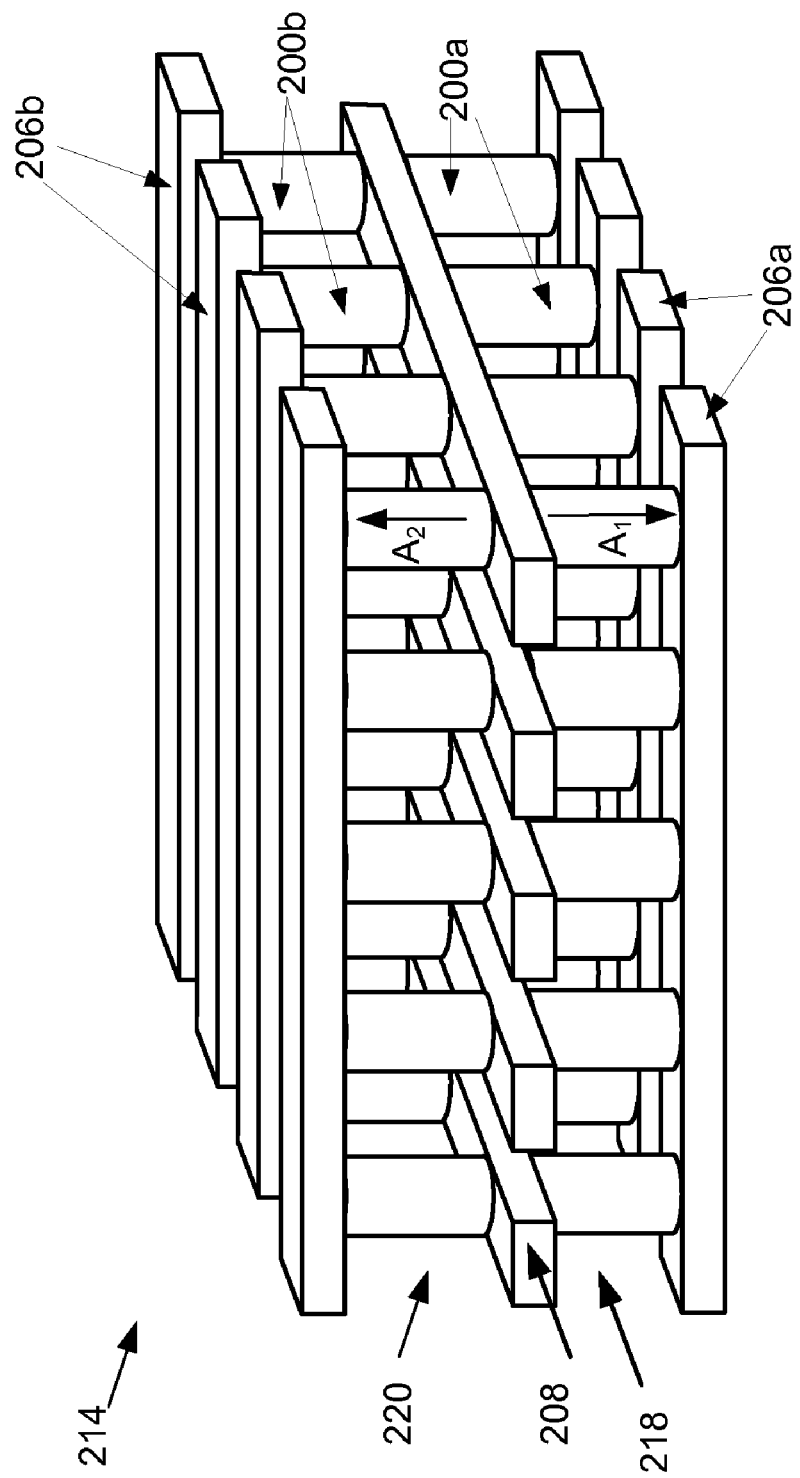
FIG. 4 is a simplified perspective view of a portion of a three dimensional memory array.

In some embodiments, the memory levels may be formed as described in U.S. Pat. No. 6,952,030, "High-Density Three-Dimensional Memory Cell," which is hereby incorporated by reference herein in its entirety. For instance, the upper conductors of a first memory level may be used as the lower conductors of a second memory level that is positioned above the first memory level as shown in FIG. 4. This configuration may be referred to as a fully mirrored structure. A plurality of substantially parallel and coplanar conductors 206a form a first set of bit lines at a first memory level 218. Memory cells 200a at level 218 are formed between these bit lines and adjacent word lines 208. In the arrangement of FIG. 4, word lines 208 are shared between memory layers 218 and 220 and thus, further connect to memory cells 200b at memory level 220. A third set of conductors form the bit lines 206b for these cells at level 220. These bit lines 206 may in turn be shared between memory levels 200b and an additional memory level (not depicted in FIG. 4). The arrangement of the diodes' polarity and the respective arrangement of the word lines and bit lines can vary by embodiment. Additionally, more than two memory levels can be used.

In some embodiments, the diodes on adjacent memory levels point in opposite directions, as described in Published U.S. Patent Application 2007/0190722, filed Mar. 27, 2007 and titled "Large Array Of Upward Pointing P-I-N Diodes Having Large And Uniform Current," which is hereby incorporated by reference herein in its entirety. For example, the diodes of the first memory level 218 may be downward pointing diodes as indicated by arrow $A_1$ (e.g., with n regions at the bottom of the diodes), while the diodes of the second memory level 220 may be upward pointing diodes as indicated by arrow $A_2$ (e.g., with p regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

FIGS. 1-4 show memory cells in a cylindrical shape and conductors in the shapes of rails according to the disclosed arrangements. However, the technology described herein is not limited to any one specific structure for a memory cell. Other structures can also be used to form memory cells that include reversible resistivity-switching material. For example, the following patents provide examples of structures of memory cells that can be adapted to use reversible resistivity-switching material: U.S. Pat. No. 6,952,043; U.S. Pat. No. 6,951,780; U.S. Pat. No. 6,034,882; U.S. Pat. No. 6,420,215; U.S. Pat. No. 6,525,953; and U.S. Pat. No. 7,081,377.

Figure 5:
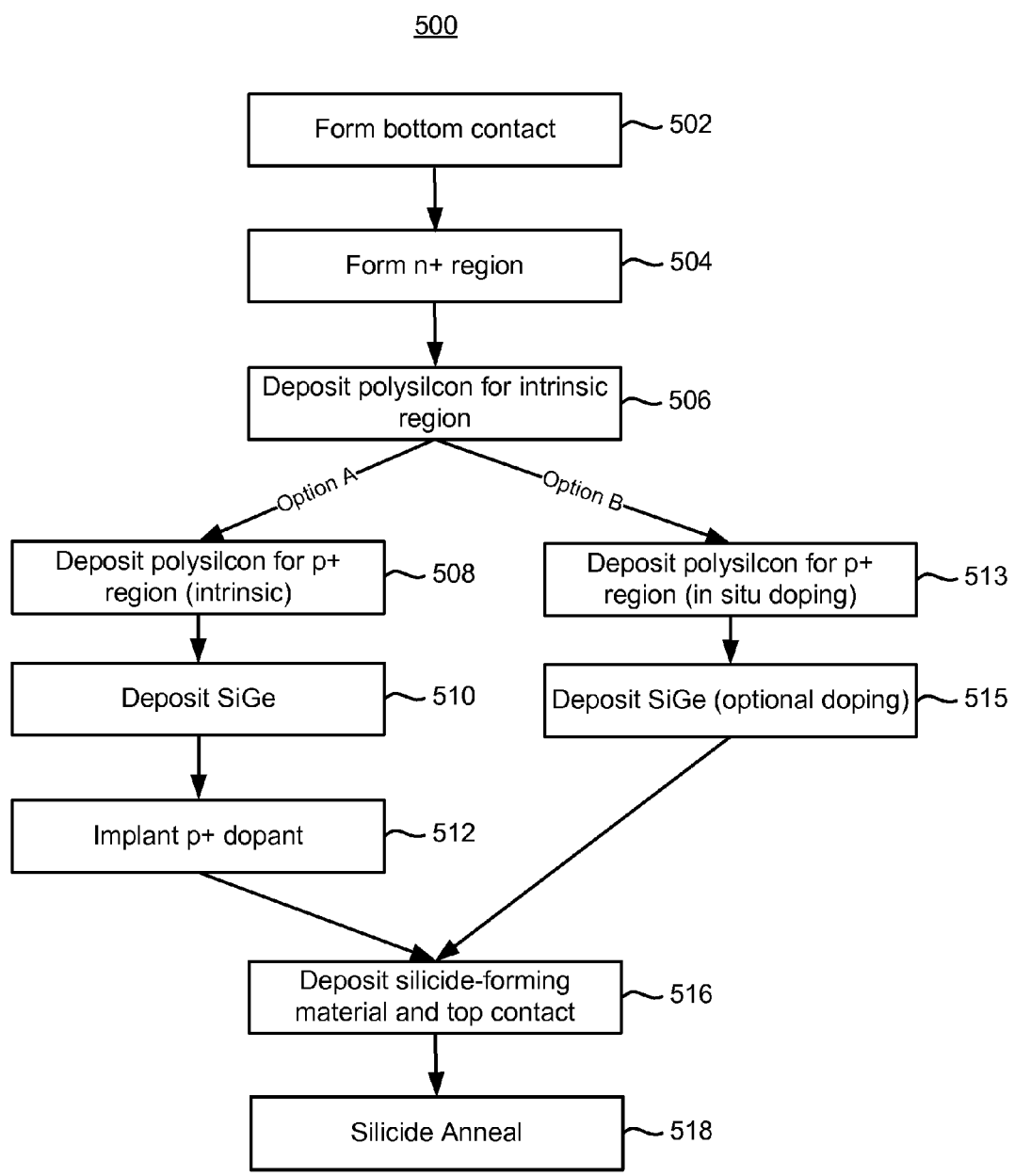
FIG. 5 depicts one embodiment of a process for forming a p-i-n diode.

FIG. 5 depicts one embodiment of a process 500 for forming a semiconductor p-i-n diode. Process 500 describes a general process for forming a p-i-n diode 204, and is not limited to use in a memory array. However, process 500 may be used to form diodes that are used as steering elements in 3-D memory arrays. Process 500 may also be used to form semiconductor p-i-n diodes that are used themselves as memory cells in memory arrays. Not all process steps are described in process 500. For example, formation of masks, patterning the masks, and etching are not described. In step 502, a bottom conductive contact 213 is formed. The bottom conductive contact 213 may be formed from TiN or another conductor. In some embodiments, the bottom contact 213 is formed over a bottom conductor 206. However, the bottom contact 213 can be formed over any other conductive material.

In step 504, an n+ polysilicon region 242 is formed over the bottom contact 213. Region 242 can be formed by any deposition and doping method known in the art. Silicon can be deposited and then doped or the silicon may be doped in situ by flowing a gas providing n-type dopant atoms during deposition of the silicon. Examples of n-type impurities include, but are not limited to, phosphorus and arsenic. An example range of thickness for region 242 is 100 Å-200 Å; however, region 242 may be thicker or thinner.

In step 506, polysilicon that will be used for the intrinsic region 244 is deposited. The polysilicon is not intentionally doped. Intrinsic region 244 can be formed by any method known in the art. In one embodiment, the intrinsic region 244 is silicon. An example range of thicknesses for the deposited intrinsic polysilicon is between about 1700 and 1800 angstroms thick.

After step 506 there are two options for forming the p+ region 246 and the SiGe region 233. Option A is depicted in steps 508-512 and option B is depicted in steps 513-515. If Option A is used, then at step 508, polysilicon is deposited for the p+ region 246. In option A, region 246 is doped later; therefore, the polysilicon is not intentionally doped in step

508. Note that steps 506 and 508 could be performing during the same process step, but separately listed for purposes of discussion.

In step 510, SiGe is deposited over the intrinsic polysilicon of what will become the p+ region 246. The SiGe may be deposited by continuing to deposit the silicon and adding a selected amount of germanium to the silicon. In one embodiment, the relative concentration is $Si_{0.8}Ge_{0.2}$; however, other relative concentrations of silicon and germanium may be used. An example range of initial thickness of the deposited SiGe is 100 Å-200 Å; however, the SiGe may be thicker or thinner.

In step 512, a p-dopant is implanted to form p+ region 246 below the SiGe region 233. In one embodiment, ion implantation is performed. When the ions diffuse, heavily doped p-type region 246 is formed. The p-type dopant may be a shallow implant of boron, with an implant energy of, for example, 1-5 keV, and an example dose of about $8E14$-$5E15/cm^2$. Note that it is not required that SiGe region 233 be doped or that the doping concentration be the same in the SiGe region 233 and the p+ region 246. However, in some embodiments, the SiGe region is doped with the same dopant as the p+ region 246. After the p-type dopant has diffused, the p-type dopant should extend below the SiGe region 233, such that p+ region 246 exists below the SiGe region 233. This concludes option A.

If option B is used, then at step 513 the p+ region 246 is formed by in situ doping. The silicon may be doped in situ by flowing a gas providing p-type dopant atoms during deposition of the silicon. Examples of p-type impurities include, but are not limited to, boron and $BF_2$ as implant species and $BCl_3$ as in-situ dopant.

In step 515, SiGe is deposited over the p+ region 246. The SiGe may be doped, but that is not required. For example, the SiGe may be doped in situ by flowing a gas providing p-type dopant atoms during deposition of the SiGe. This concludes option B.

After the SiGe has been deposited, a silicide forming material is deposited over the SiGe region, in step 516. The silicide forming material may include, but is not limited to, titanium, cobalt, tantalum, platinum, tungsten or nickel. As an example, titanium is deposited over the SiGe. An example, thickness for the titanium is 10-20 Å. In one embodiment, prior to depositing the silicide forming material, a thin capping layer of intrinsic polysilicon is deposited over the SiGe. An example thickness for capping layer is 10-50 Å; however, the capping layer may be thicker or thinner. In one embodiment, after depositing the silicide forming material another material is deposited to complete the top contact 230. For example, if the silicide forming material is titanium, then TiN may be deposited over the titanium. The top contact 230 may be a material other than TiN.

In step 518, a thermal anneal is performed to create a silicide in the SiGe region. During this step in which there is an elevated temperature, the silicide forming material may react with some portion of the SiGe to form a silicide layer. In one embodiment, the thermal anneal is performed at a temperature between 550-650 degrees Celsius for about 60 seconds. However, the temperature could be lower or higher. Moreover, the anneal could last longer or less than 60 seconds. The silicide that forms in the SiGe region depends on the silicide forming material. For example, the silicide may be a titanium silicide-germanide if the silicide forming material was titanium. If the silicide forming material is cobalt, then the silicide may be cobalt silicide-germanide. Other silicides may be formed in the SiGe region 233.

Note that it is not required that the entire SiGe region 233 is silicided; however in some embodiments, all of the SiGe region 233 is silicided. The initial thickness of the SiGe region 233 may be selected based on how much will be consumed (converted to silicide) during the silicide process. For example, if 1 Å of titanium consumes about 5-10 Å (or less) of silicon and if the Ti thickness is 20 Å, then the SiGe may be about 200 Å (or more).

Note the process 500 described formation of a p-i-n diode 204 in which in step 504 an n-type impurity is used. However, in step 504, rather than forming an n+ region, a p+ region can be formed. Then, in either step 512 or 513, rather than implanting a p+ dopant, an n-type dopant can be implanted.

In some embodiments, the p-i-n diode 204 is part of a memory array. In this case, an entire level of p-i-n diodes 204 may be formed using the same process steps. However, note that it is not required that at each level the p-i-n diodes 204 are formed the same way. For example, p-i-n diodes may be formed with the SiGe region 233 that is discussed herein at one level but without the SiGe region 233 at another level. In one embodiment, p-i-n diodes 204 at every other level have the SiGe region. The relative concentration of silicon to germanium (and other factors) can be adjusted to help match the forward bias current of the p-i-n diodes at one level to another level. For example, the forward bias currents of up-pointing diodes at one level can be matched to the forward bias current of down-pointing diodes at another level.

Figure 6:
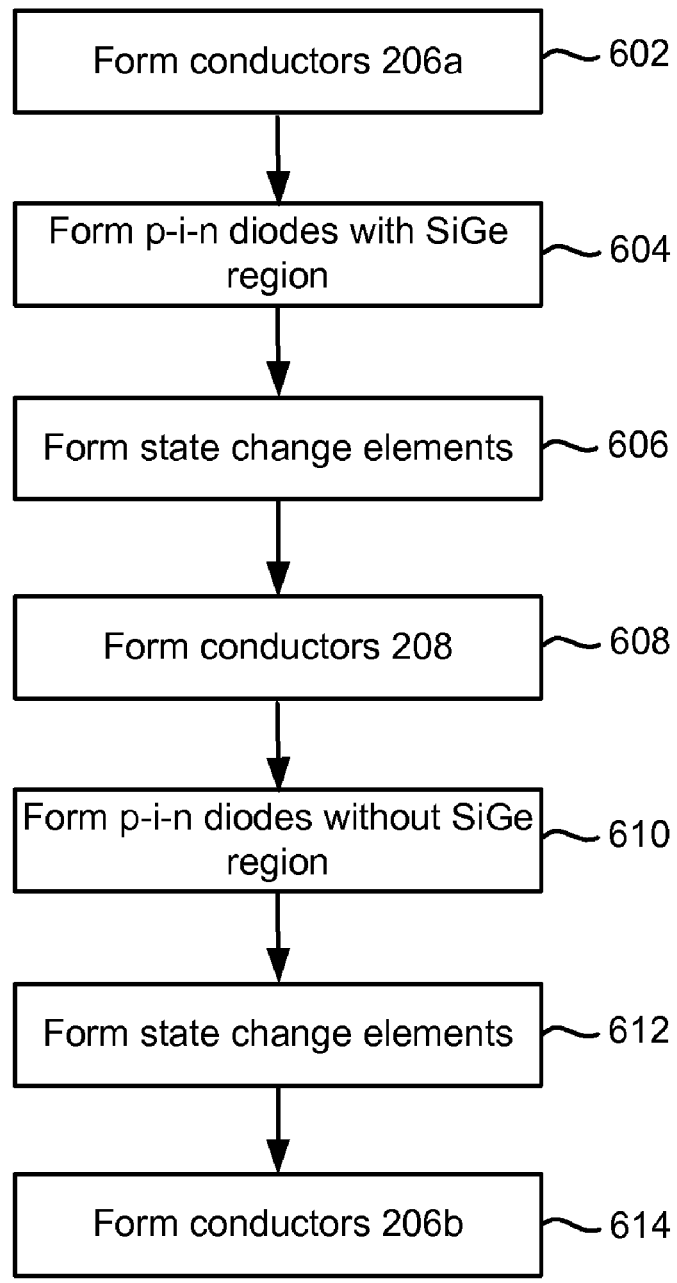
FIG. 6 depicts one embodiment of a process for forming a memory array.

FIG. 6 shows a process 600 of one embodiment of forming a memory array in which diodes at one level have a region of SiGe 233 and those at another level do not. The p-i-n diodes 204 are used as steering elements in this example. However, the p-i-n diodes 204 might serve another purpose such as storing information based on the resistance of the p-i-n diode 204. Process 600 may be used to form an array such as memory array 214 depicted in FIG. 4.

Figure 7:
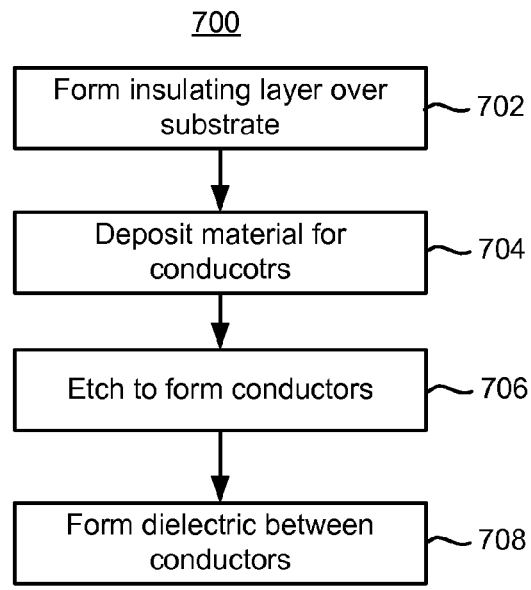
FIG. 7 depicts one embodiment of a process of forming conductors in a memory array.

In step 602, conductors 206a, which are the bottom-most conductors of the memory array 214, are formed over a substrate. FIG. 7 depicts further details of one embodiment of forming conductors 206a. Note that step 602 may include forming a dielectric material between the conductors 206a.

Figure 8:
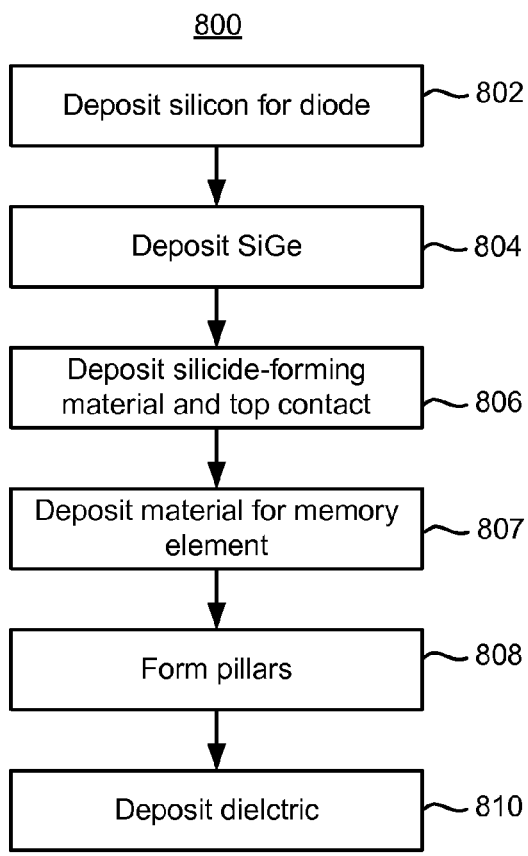
FIG. 8 depicts one embodiment of a process of forming p-i-n diodes.

In step 604, p-i-n diodes 204 that have a SiGe region 233 are formed above the conductors 206a. In one implementation, process 500 of FIG. 5 is used to form the p-i-n diodes 204. These p-i-n diodes 204 may be either up-pointing or down-pointing. Process 800 of FIG. 8 depicts one embodiment of forming many p-i-n diodes, which may be used to implement step 604.

Figure 9:
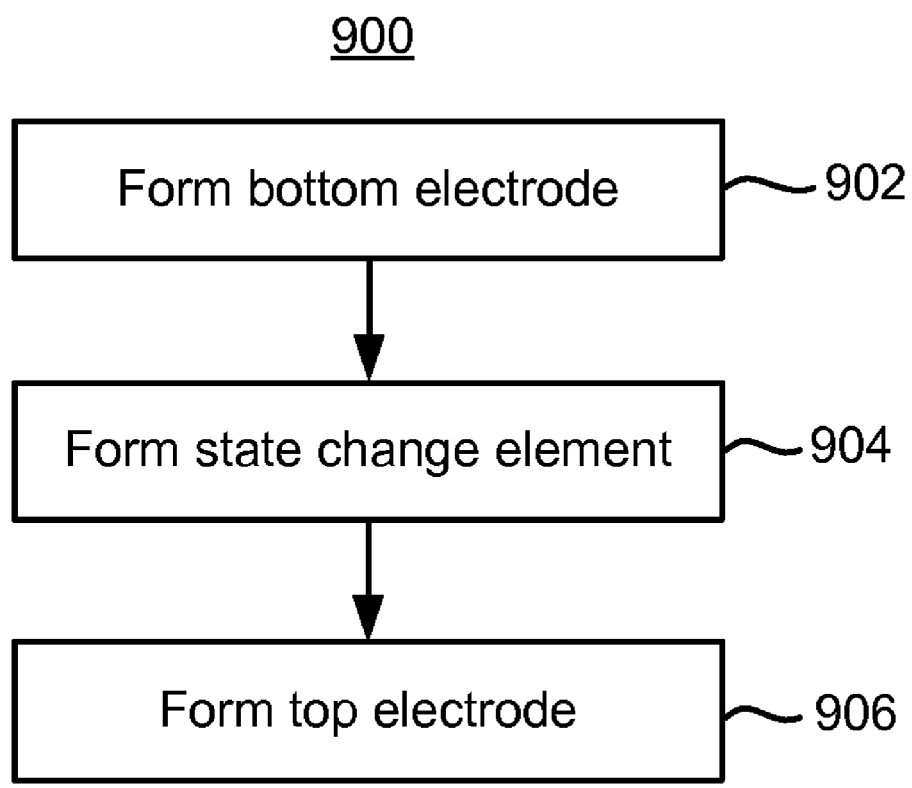
FIG. 9 depicts one embodiment of a process of forming a resistive state change element.

In step 606, reversible resistance-switching elements 202 are formed above the p-i-n diodes 204. Process 900 of FIG. 9 depicts one embodiment of forming reversible resistance-switching elements 202. In some embodiments, steps 604 and 606 are switched such that the p-i-n diodes 204 are formed above the reversible resistance-switching elements 202. The result of forming the p-i-n diodes and reversible resistance-switching elements 202 may be to form pillars (element 200a, FIG. 4) with dielectric material between the pillars.

In step 608, conductors 208 are formed. This completes the formation of one level 218 of memory array 214. Conductor 208 is also used as a bottom conductor for the second level 220 of the memory array.

In step 610, p-i-n diodes without the SiGe region 233 are formed above conductor 208. Referring to the arrows labeled A1 and A2 in FIG. 4, the p-i-n diodes at the second level 220 may be down-pointing if the diode at the lower level 218 was up-pointing. However, the reverse might also be true in that the diode at level 220 may be up-pointing if the diode at the lower level 218 was down-pointing. In some embodiments, the p-i-n diodes at the second level 220 are formed without the SiGe region 233.

In step 612, reversible resistance-switching elements 202 are formed above the p-i-n diodes at the second level 220. As with the lower level 218, the p-i-n diodes may be formed above the reversible resistance-switching elements 202 instead of below them.

In step 614, conductors 206b are formed. The result of forming conductors 206b may include forming a dielectric material between the conductors 206b. This concludes formation of the first two levels 218, 220 of the memory array 214. Additional levels may be added. The pattern of alternating up-pointing and down-pointing diodes may be continued. Also, the pattern of alternating diodes with SiGe regions 233 and diodes without SiGe regions may be continued.

When performing process 600, the concentration of the germanium in the SiGe may be selected to cause the forward bias current of the p-i-n diodes at the first level 218 to match, or at least come very close to the forward bias current of the p-i-n diodes at the second level 220. The following provides some information regarding adjusting the germanium concentration matching the currents. SiGe has a smaller band gap than silicon. For example, silicon may have a bandgap of 1.12 eV, whereas germanium may have a bandgap of 0.66 eV. The band gap of SiGe may thus range between 0.66 eV-1.12 eV depending on the relative concentrations of silicon and germanium. The lower bandgap of SiGe (relative to Si) may result in a lower barrier height at the SiGe/TiN interface (as compared to a Si/TiN interface), which may lower the electrical resistance to the top contact 230. This may improve forward bias current density of the diode. For example, in some implementations, at a forward bias voltage of 2V, the current density may be improved by a factor of 2-5 times compared to a diode without the SiGe region. The net is that the amount of germanium in the SiGe is a parameter that can be adjusted to help match the forward bias current of the diodes of one level of the memory array 214 to another.

Other factors may be used to match the forward bias current of the diodes of one level of the memory array 214 to another. For example, the diode heights at different memory array levels may be different from each other. As a specific example, a shorter diode height (or a specific region such as the intrinsic region) may lead to a greater forward bias current, whereas a greater height may lead to a lower forward bias current. Note that a greater diode height (e.g., thicker intrinsic region) may lead to higher diode resistance and a shorter diode height (e.g., thinner intrinsic region) may lead to reduced diode resistance. However, also note that a shorter diode may lead to a higher reverse leakage current at similar reverse bias voltage as compared to the diode with thicker intrinsic region. In one embodiment, the heights of the intrinsic regions are tailored to help match the diode forward bias currents.

Note that in the embodiment of FIG. 6, p-i-n diodes 204 at some levels have the SiGe region 233 whereas diodes at other levels do not have the SiGe region 233. In some embodiments, p-i-n diodes 204 at all levels of the memory array may have the SiGe region 233. However, the SiGe region 233 is not necessarily the same at all levels. For example, the concentration of germanium in the SiGe may be different at different levels to help match the forward bias current of diodes at different memory levels. For example, up-pointing p-i-n diodes 204 may have a different concentration of germanium in the SiGe region than down-pointing p-i-n diodes 204.

FIG. 7 depicts one embodiment of a process of forming conductors. Process 700 is one implementation of step 602 of process 600. Formation of the memory array may begin with a substrate. The substrate can be any semiconducting substrate known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein. For example, the substrate may include circuits that are electrically connected to the conductors 206, 208 in order to read and program the memory array. In step 702, an insulating layer is formed over substrate. The insulating layer can be silicon oxide, silicon nitride, or any other suitable insulating material.

In step 704, material for first conductors 206a is deposited over the insulator. An adhesion layer may be included between the insulating layer and the conducting layer to help the conducting layer adhere to the insulating layer. If the overlying conducting layer is tungsten, titanium nitride may be used as an adhesion layer. The conducting layer may comprise any conducting material known in the art, such as tungsten, or other materials, including tantalum, titanium, copper, cobalt, or alloys thereof.

Once all the layers that will form the conductor rails 206a have been deposited, the layers are patterned and etched using any suitable masking and etching process to form substantially parallel, substantially coplanar conductors 206a, in step 706. In one embodiment, photoresist is deposited, patterned by photolithography and the layers etched, and then the photoresist removed using standard process techniques.

Next, in step 708, a dielectric material is deposited over and between conductors 206a. The dielectric material can be any known electrically insulating material, such as silicon oxide, silicon nitride, or silicon oxynitride. In one embodiment, silicon dioxide deposited by a high-density plasma method is used as dielectric material. Excess dielectric material on top of conductor rails 206a may be removed, exposing the tops of conductors 206a separated by dielectric material, and leaving a substantially planar surface. This removal of dielectric overfill to form the planar surface can be performed by any process known in the art, such as chemical mechanical polish (CMP) or planarization etchback. In an alternative embodiment, conductors 206a could be formed by a Damascene method. After step 708, the p-i-n diodes 204 may be formed above the conductors 206a. Alternatively, resistive state change elements 202 may be formed above the conductors 206a prior to forming p-i-n diodes 204.

Figure 10A:
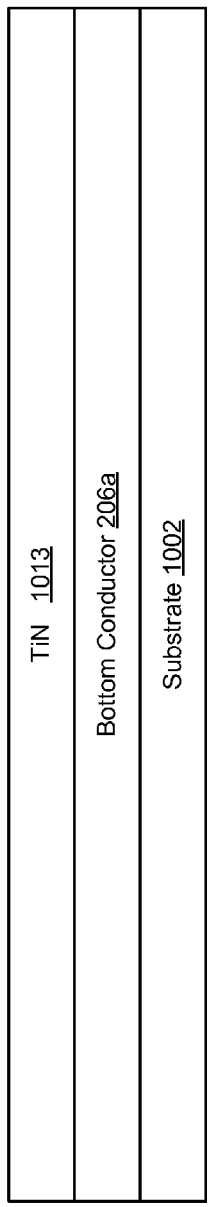

FIG. 8 depicts one embodiment of a process 800 of forming many p-i-n diodes. Process 800 is one implementation of step 604 of process 600. Process 800 may be performed after performing process 700 is used to form conductors 206a. In one embodiment, resistive state change elements 202 are formed between the conductors 206a and the p-i-n diodes 204. Prior to process 800, bottom contacts 213 may be formed on the conductors 206a. FIGS. 10A-10G depict results after various steps of process 800 for an example in which the lower heavily doped region is n+ and the upper is p+. FIGS. 10A-10G depict a perspective along a line that runs parallel to one bottom conductor 206a. Note that the relative thicknesses of the layers are not shown to scale. FIG. 10A shows results after forming conductors over a substrate and a layer of TiN to be used for bottom contacts. Specifically, the substrate 1002, one bottom conductor 206a, and a TiN layer 1013 are depicted. At the level of the bottom conductor 206a there is also dielectric which cannot be seen in FIG. 10A.

Figure 10B:
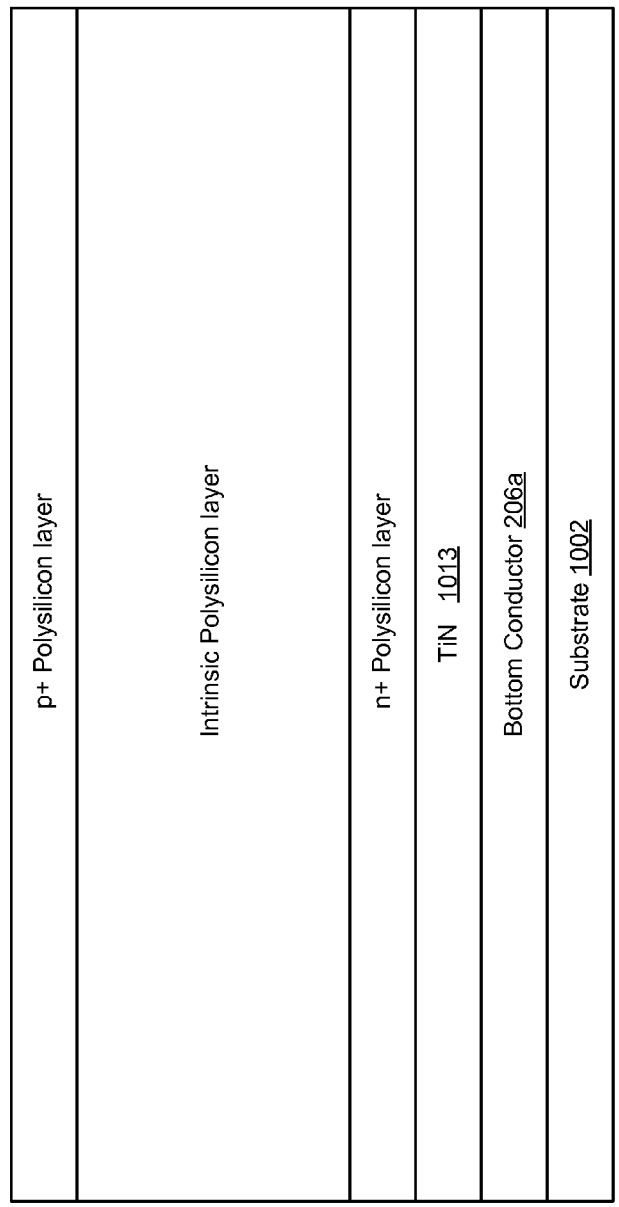
Figure 10C:
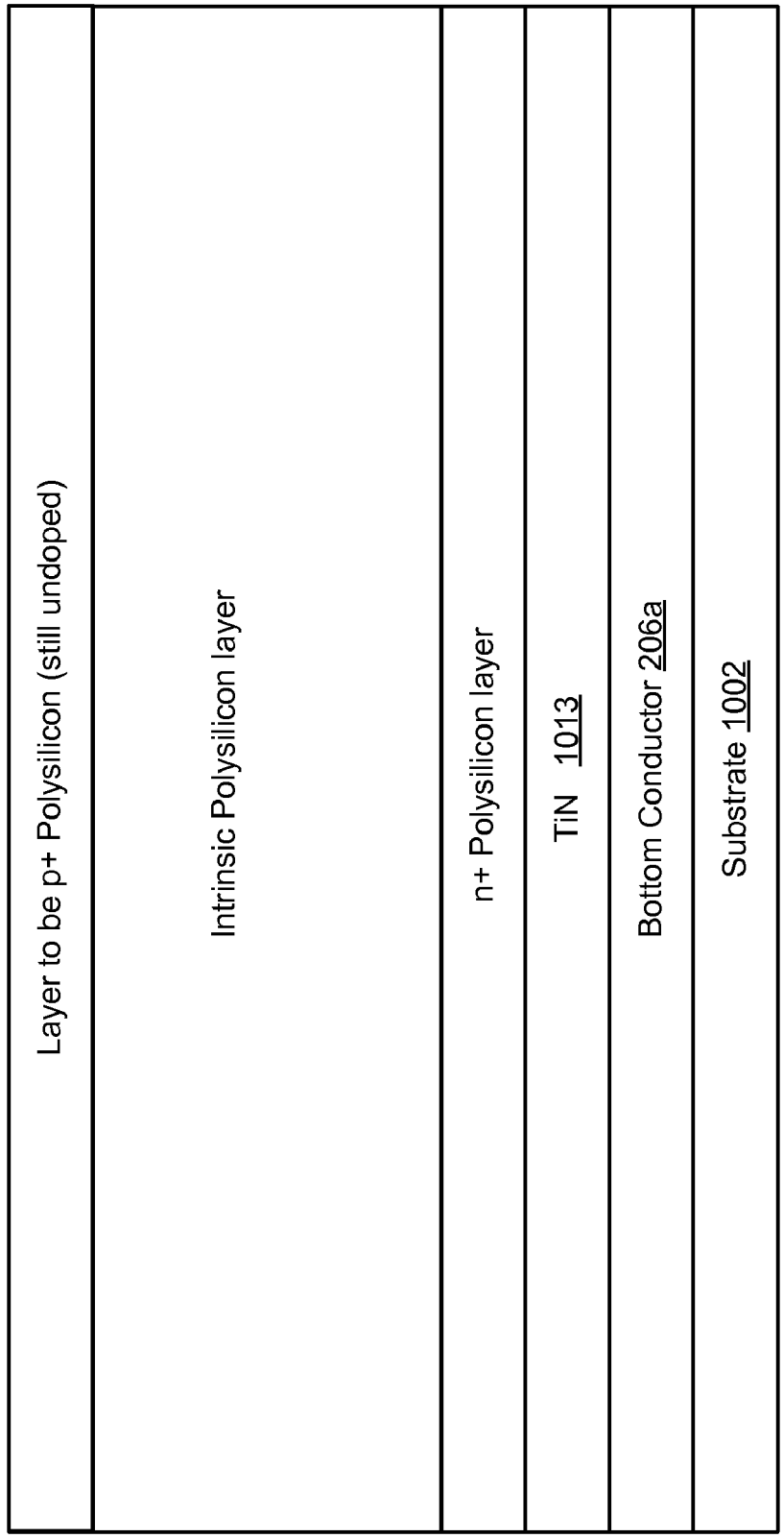

In step 802, a layer of semiconductor material that will be patterned into pillars for the p-i-n diodes 204 is deposited. Step 802 may include depositing a layer of silicon over the conductors 206a and the dielectric that resides between the conductors 206a. In one embodiment, the semiconductor material is silicon. In situ doping may be performed while depositing the silicon such that the lower portion is heavily doped to be used as either n+ regions or p+ regions. In situ doping may also be performed while depositing the silicon such that the upper portion is heavily doped to be used as either n+ regions or p+ regions. This is similar to option B in process 500. However, neither the lower portion nor the upper portion needs to be doped in situ. Thus, the silicon can be deposited and then doped or it may be doped in situ by flowing a gas providing n-type or p-type dopant atoms during deposition of the silicon. FIG. 10B depicts results after step 802 if the p+ layer is formed in situ. FIG. 10C depicts results if the p+ layer is not doped in situ, and hence is still undoped at this stage.

Figure 10D:
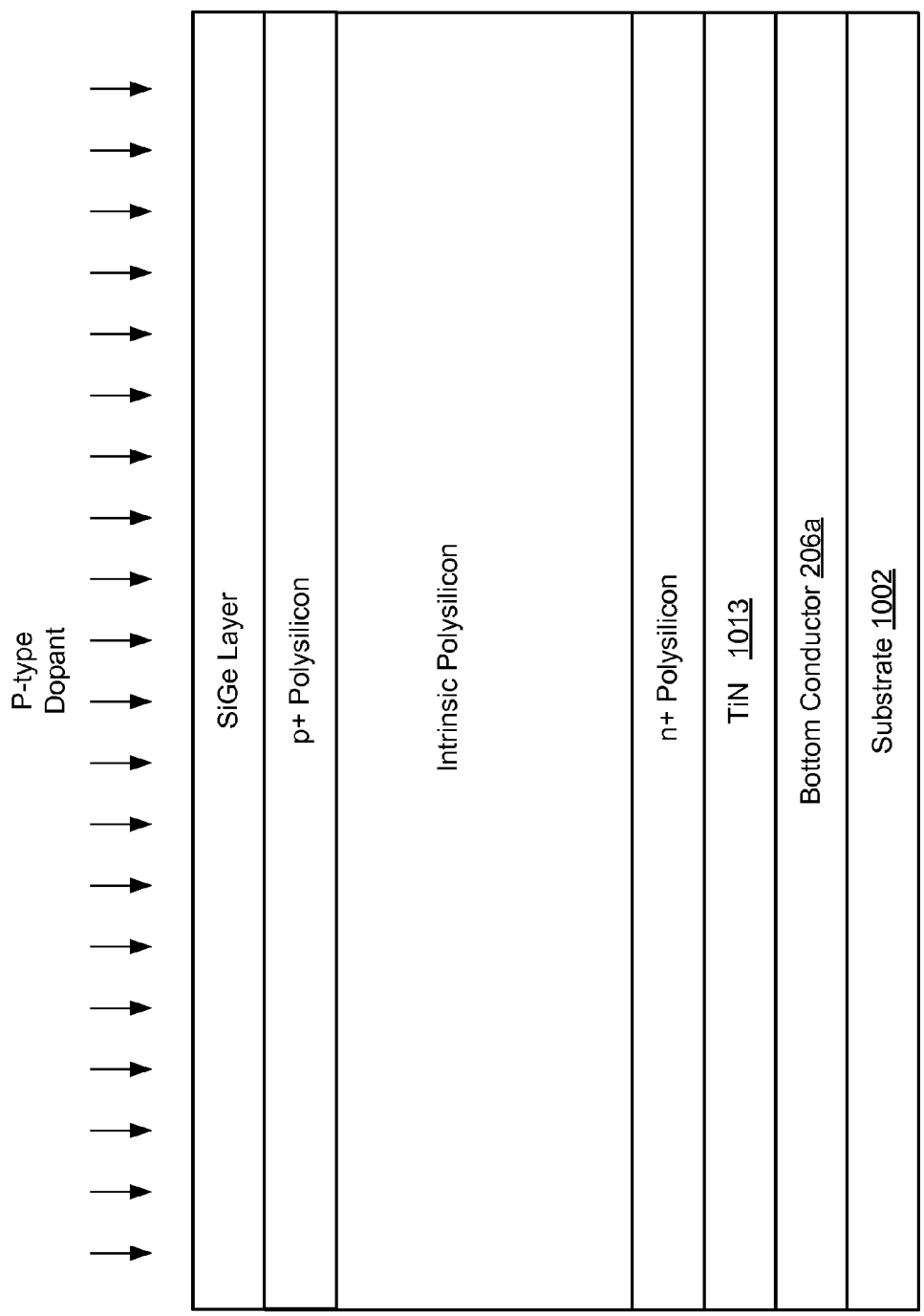
Figure 10E:
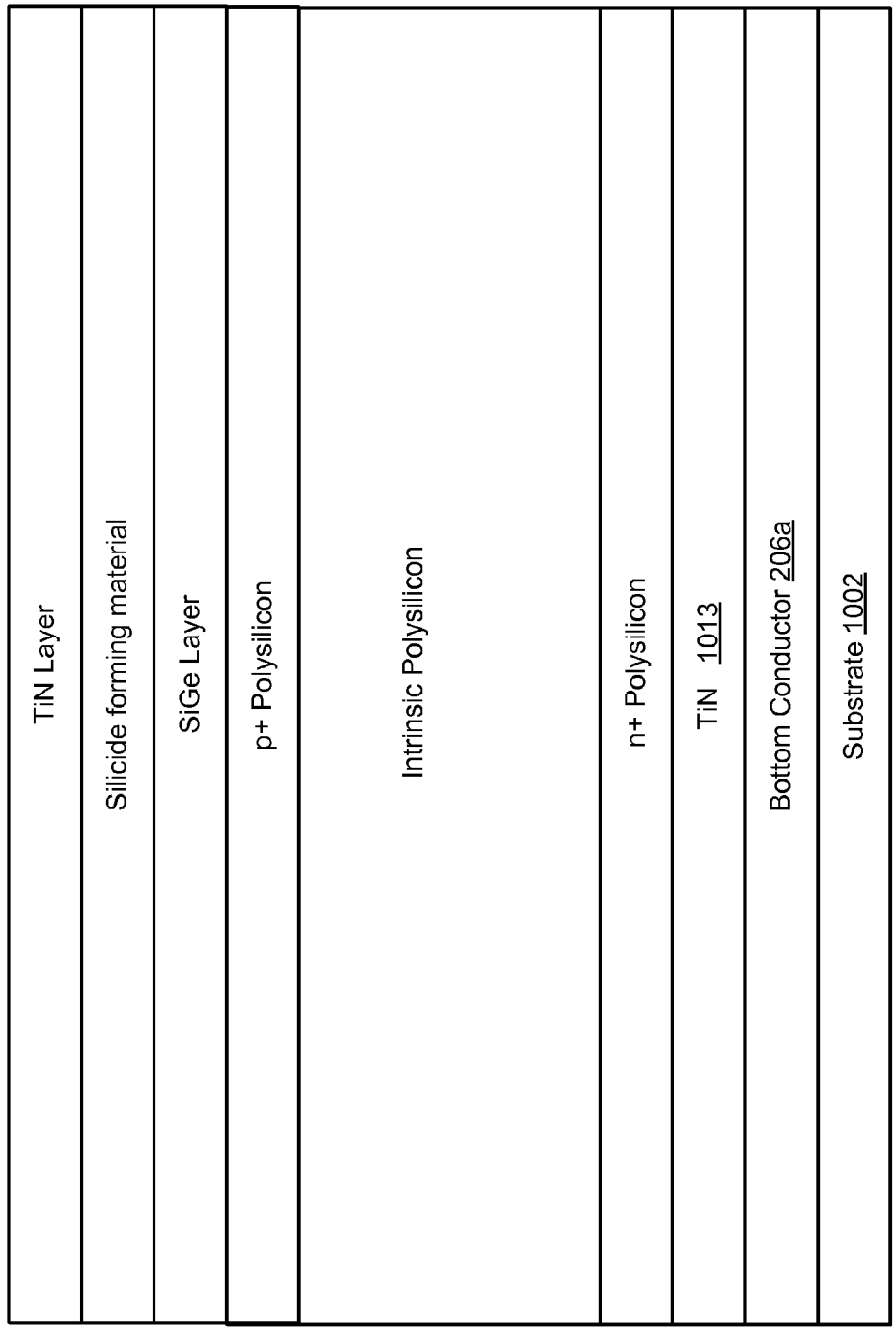

In step 804, a layer of SiGe is deposited over the polysilicon layer. If doping has not yet been performed to form the upper heavily doped region, this doping may be performed now. This is similar to option A in process 500. FIG. 10D illustrates implanting a p-type dopant into both the SiGe layer and a layer just below the SiGe layer. In step 806, a layer of a silicide forming material and a layer of material for the top contact (e.g., TiN) are deposited over the SiGe layer. FIG. 10E depicts results after step 806. Note that after depositing the silicide forming material, a thermal anneal may be performed to form a silicide. As an example, a rapid thermal anneal (RTA) between 550-650 degrees Celsius may be performed for about 60 seconds.

In step 807, material for memory elements 202 are deposited. For example, a layer to be used to form bottom electrodes 234, a layer to be used to form state change elements 231, and a layer to be used to form top electrodes 232 are deposited. Process 900 of FIG. 9 provides additional details of forming memory elements 202. The layers for the memory elements 202 can be deposited on top of TiN layer shown in FIG. 10E. Note that the material for the memory elements 202 could also be deposited prior to depositing the material for the diodes.

In step 808, pillars are formed out of the polysilicon, the SiGe layer, silicide forming material, top contact material, and memory element material. Pillars can be formed using any suitable masking and etching process. For example, photoresist can be deposited, patterned using standard photolithography techniques, and etched. Then, the photoresist may be removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask. In some embodiments, the pillars have about the same pitch and about the same width as conductors 206 below, such that each pillar is formed on top of a conductor 206. Some misalignment can be tolerated. FIG. 10F depicts results after step 808 in which each pillar corresponds to one p-i-n diode. Note that the memory elements 202 are not depicted in FIG. 10F so as to not obscure the diagram.

Figure 10G:
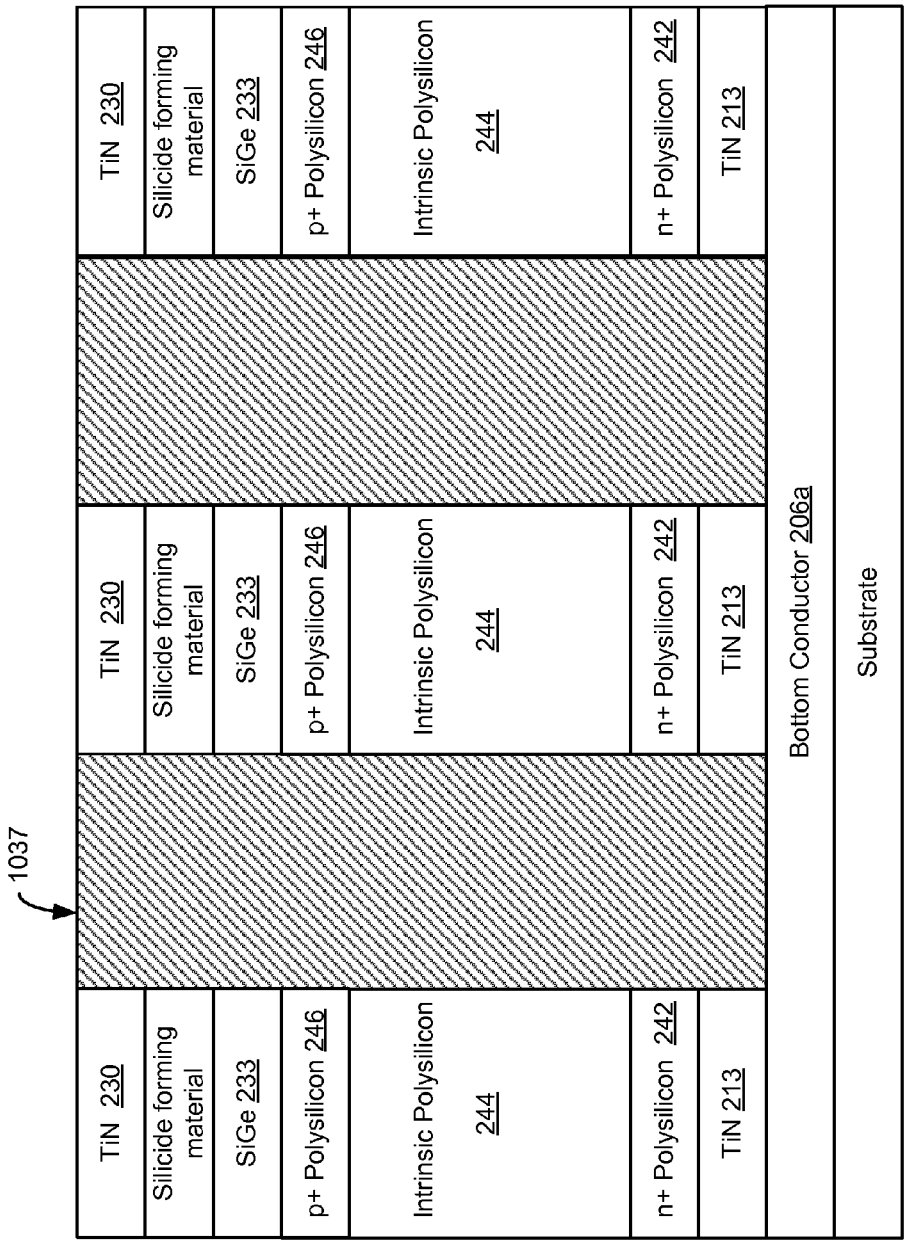

In step 810, dielectric material 1037 is deposited over and between the semiconductor pillars, filling the gaps between them. Dielectric material 1037 can be any known electrically insulating material, such as silicon oxide, silicon nitride, or silicon oxynitride. In one embodiment, silicon dioxide is used as the insulating material. The dielectric material on top of pillars is removed, exposing the tops of pillars separated by dielectric material, and leaving a substantially planar surface. This removal of dielectric overfill can be performed by any process known in the art, such as CMP or etchback. After forming the p-i-n diode 204, resistive state change elements may be formed (step 606, process 600). FIG. 10G depicts results after step 810. Note that in addition to the thermal anneal that is used to form the silicide, there may be one or more thermal anneals. For example, there may be a thermal anneal to crystallize the polysilicon and to activate the dopants. In one embodiment, Rapid Thermal Anneal (RTA) is done for 60 seconds at 700-750 degrees Celsius. However, other temperatures and times could be used. Note that if a memory device with multiple layers of diodes is constructed there might be multiple anneals to form the silicides (e.g., there might be a separate anneal to form each silicide region), but only one anneal to crystallize the polysilicon and activate the dopants.

FIG. 9 depicts one embodiment of a process 900 of forming a resistive state change element 202. Process 900 is one implementation of steps 606 and 612 of process 600. In step 902, a bottom electrode 234 is formed. The bottom electrode 234 may be formed from TiN. The formation of the bottom electrode 234 can be achieved by depositing TiN (or another material) and patterning and etching. The bottom electrode 234 can be deposited using a variety of techniques including, but not limited to, chemical vapor deposition (CVD), physical vapor deposition (PVD), atomic layer deposition (ALD), and sputtering. The bottom electrode 234 forms an electrical connection to the p-i-n diode 204. In some embodiments, the bottom electrode 234 also serves as the top contact 230 for the p-i-n diode 204.

In step 904, a state change element 231 is formed. Many different types of state change elements can be formed in this step. In one embodiment, the state change element 231 is a metal oxide (MeO$_x$). The MeO$_x$ can be deposited using a variety of techniques including, but not limited to, chemical vapor deposition (CVD), physical vapor deposition (PVD), atomic layer deposition (ALD), and sputtering. In one embodiment, the state change element 231 is Ge$_2$Sb$_2$Te$_5$ (GST). GST has a property of reversible phase change from crystalline to amorphous-allowing two levels per cell. However, quasi-amorphous and quasi-crystalline phases may also be used to allow additional levels per cell with GST. In some embodiments, the state change element 231 is formed from a carbon material. A state change element 231 that is formed from carbon may comprise any combination of amorphous and graphitic carbon. In one aspect, the state change element 231 is a carbon nanotube (CNT).

In step 906, a top electrode 232 is formed. The top electrode 232 may be formed from a wide variety of materials including, but not limited to, platinum, TiN, TaN and WN. The top electrode 232 can be deposited using a variety of techniques including, but not limited to, chemical vapor deposition (CVD), physical vapor deposition (PVD), atomic layer deposition (ALD), and sputtering.

As discussed herein, one embodiment is a semiconductor device that includes the following elements. The device has a first region of silicon that is doped with a first material having a first conductivity, a second region of silicon above the first region that is not intentionally doped, a third region of silicon above the second region that is doped with a second material having a second conductivity that is opposite the first conductivity, a region that includes SiGe above the third region, and a conductive contact above the SiGe region. In some embodiments, at least a portion of the SiGe includes a silicide.

One embodiment is a method of forming a semiconductor device that includes the following steps. A first region of polysilicon that is doped with a first material having a first conductivity is formed. A second region of polysilicon is formed over the first region. The second region is not intentionally doped. A third region of polysilicon is formed over the second region. The third region is doped with a second material having a second conductivity that is opposite from the first conductivity. A region of SiGe is formed over the third region of polysilicon. A top conductive contact is formed over the region of SiGe. In some embodiments, a region comprising a silicide forming material is deposited over the SiGe and thermal annealing is performed to react the silicide forming material with the SiGe to form a silicide.

One embodiment a three-dimensional memory array comprising the following elements. The memory array has a first conductive line above a substrate, a second conductive line above the first conductive line, and a third conductive line above the second conductive line. A first p-i-n diode is coupled between the first conductive line and the second conductive line. The first p-i-n diode includes a first polysilicon region that is doped with an impurity having a first conductivity type, a second polysilicon region above the first polysilicon region that is intrinsic, and a third polysilicon region above the second polysilicon region. The third polysilicon region is doped with an impurity having a second conductivity type. The first p-i-n diode also includes a SiGe region above the third polysilicon region and a top conductive contact above the third polysilicon region. The memory also has a second p-i-n diode that is coupled between the second conductive line and the third conductive line. The second p-i-n diode has a first polysilicon region that is doped with an impurity having the second conductivity type, a second polysilicon region above the first region that is intrinsic polysilicon, a third polysilicon region above the second region that is doped with an impurity having the first conductivity type, and a top conductive contact above the third polysilicon region. In some aspects, the SiGe region of the first p-i-n diode has a composition that is selected such that the forward bias current of the first p-i-n diode will substantially match the forward bias current of the second p-i-n diode.

One aspect is a method of forming a 3-D memory array comprising the following steps. A first conductive line is formed over a substrate and a first p-i-n diode is formed over the first conductive line. Forming the first p-i-n diode includes the following steps. A first region of polysilicon that is doped with a first material having a first conductivity is formed, a second region of polysilicon is formed over the first region. The second region is not intentionally doped. A third region of polysilicon is formed over the second region. The third region is doped with a second material having a second conductivity that is opposite from the first conductivity. A region of SiGe is formed over the third region of polysilicon. A second conductive line is formed over the first p-i-n diode. A second p-i-n diode is formed over the second conductive line. Forming the second p-i-n diode includes the following steps. A fourth region of polysilicon that is doped with a material having the second conductivity is formed. A fifth region of polysilicon is formed over the fourth region. A sixth region of polysilicon that is doped with a material having the first conductivity is formed over the fifth region. A third conductive line is formed over the second p-i-n diode. In some aspects, forming the region of SiGe over the third region of polysilicon includes forming the SiGe region with a composition of germanium to silicon that is selected such that the forward bias current of the first p-i-n diode will substantially match the forward bias current of the second p-i-n diode.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A three-dimensional memory array comprising:
a first conductive line above a substrate;
a second conductive line above the first conductive line;
a third conductive line above the second conductive line;
a first p-i-n diode that is coupled between the first conductive line and the second conductive line, the first p-i-n diode including a first silicon region that is doped with an impurity having a first conductivity type, the first p-i-n diode including a second silicon region above the first silicon region that is intrinsic, the first p-i-n diode including a third silicon region above the second silicon region, the third silicon region is doped with an impurity having a second conductivity type, the first p-i-n diode includes an SiGe region above the third silicon region, the first p-i-n diode including a top conductive contact above the third silicon region; and
a second p-i-n diode that is coupled between the second conductive line and the third conductive line, the second p-i-n diode having a first silicon region that is doped with an impurity having the second conductivity type, the second p-i-n diode having a second silicon region above the first region that is intrinsic silicon, the second p-i-n diode having a third silicon region above the second region that is doped with an impurity having the first conductivity type, the second p-i-n diode having a top conductive contact above the third silicon region.

2. The memory array of claim 1, wherein the SiGe region of the first p-i-n diode has a composition that is selected such that forward bias current of the first p-i-n diode will substantially match forward bias current of the second p-i-n diode.

3. The memory array of claim 1, wherein the second p-i-n diode does not include a SiGe region between the third silicon region and the top conductive contact of the second p-i-n diode.

4. The memory array of claim 1, wherein the second p-i-n diode further includes a SiGe region between the third silicon region and the top conductive contact, the SiGe region of the first p-i-n diode has a first concentration of germanium, the SiGe region of the second p-i-n diode has a second concentration of germanium that is different from the first concentration such that forward bias current of the first p-i-n diode will substantially match forward bias current of the second p-i-n diode.

5. The memory array of claim 1, further comprising a first reversible resistance-switching element coupled between the first conductive line and the second conductive line in series with the first p-i-n diode and a second reversible resistance-switching element coupled between the second conductive line and the third conductive line in series with the second p-i-n diode.

6. The memory array of claim 1, wherein the SiGe region includes a silicide.

7. A method of forming a 3-D memory array comprising:
forming a first conductive line over a substrate;
forming a first p-i-n diode over the first conductive line, the forming a first p-i-n diode including the following steps:

forming a first region of silicon that is doped with a first material having a first conductivity;
forming a second region of silicon over the first region, the second region is not intentionally doped;
forming a third region of silicon over the second region;
doping the third region with a second material having a second conductivity that is opposite from the first conductivity; and
forming a region of SiGe over the third region of silicon;
forming a second conductive line over the first p-i-n diode;
forming a second p-i-n diode over the second conductive line, the forming second p-i-n diode including the following steps:
forming a fourth region of silicon that is doped with a material having the second conductivity;
forming a fifth region of silicon over the fourth region; and
forming a sixth region of silicon that is doped with a material having the first conductivity over the fifth region; and
forming a third conductive line over the second p-i-n diode.

8. The method of claim 7, wherein the forming a region of SiGe over the third region of silicon includes forming the SiGe region with a composition of germanium to silicon that is selected such that forward bias current of the first p-i-n diode will substantially match forward bias current of the second p-i-n diode.

9. The method of claim 8, wherein forming the second region of the first p-i-n diode includes forming the second region to have a first height, the forming the fifth region of the second p-i-n diode includes forming the fifth region to have a second height, the first height and the second height are selected such that the forward bias current of the first p-i-n diode will substantially match the forward bias current of the second p-i-n diode.

10. The memory array of claim 7, wherein the forming a second p-i-n diode includes forming the second p-i-n diode without a SiGe region between the sixth region and the third conductive line.

11. The method of claim 7, wherein the forming a first p-i-n diode further includes:
depositing a region comprising a silicide forming material between the SiGe and the second conductive line; and
thermally annealing to react the silicide forming material with the SiGe to form a silicide.

12. A three-dimensional memory array comprising:
a first conductive line;
a second conductive line;
a third conductive line;
a first semiconductor diode that is coupled between the first conductive line and the second conductive line, the first semiconductor diode comprising:
a first region of silicon, the first region of silicon is doped with a first material having a first conductivity;
a second region of silicon that is not intentionally doped;
a third region of silicon, the third region is doped with a second material having a second conductivity that is opposite the first conductivity, the second region is between the first region and the third region; and
a region that includes SiGe adjacent to the third region;
a first conductive contact between the SiGe region and the second conductive line; and
a second semiconductor diode that is coupled between the second conductive line and the third conductive line, the second semiconductor diode comprising:
a first region of silicon that is doped with a material having the second conductivity;
a second region of silicon that is not intentionally doped; and
a third region of silicon that is doped with a material having the first conductivity, the second region of the second semiconductor diode is between the first region and the third region of the second semiconductor diode; and
a second conductive contact that forms a contact between the third region of silicon of the second semiconductor diode and the third conductive line.

13. The three-dimensional memory array of claim 12, wherein the SiGe region of the first semiconductor diode has a composition that is selected such that forward bias current of the first semiconductor diode will substantially match forward bias current of the second semiconductor diode.

14. The three-dimensional memory array of claim 13, wherein the second semiconductor diode does not include a SiGe region between its third silicon region and the second conductive contact.

15. The three-dimensional memory array of claim 13, wherein the second semiconductor diode further includes a SiGe region between its third silicon region and the second conductive contact, the SiGe region of the first semiconductor diode has a first concentration of germanium, the SiGe region of the second semiconductor diode has a second concentration of germanium that is different from the first concentration such that forward bias current of the first semiconductor diode will substantially match forward bias current of the second semiconductor diode.

16. The three-dimensional memory array of claim 12, further comprising a first reversible resistance-switching element coupled between the first conductive line and the second conductive line in series with the first semiconductor diode.

17. The three-dimensional memory array of claim 16, further comprising a second reversible resistance-switching element coupled between the second conductive line and the third conductive line in series with the second semiconductor diode.

18. The three-dimensional memory array of claim 12, wherein the SiGe region includes a silicide.

* * * * *

UNITED STATES PATENT AND TRADEMARK OFFICE
CERTIFICATE OF CORRECTION

PATENT NO. : 8,410,582 B2
APPLICATION NO. : 13/479093
DATED : April 2, 2013
INVENTOR(S) : A. Bandyopadhyay et al.

It is certified that error appears in the above-identified patent and that said Letters Patent is hereby corrected as shown below:

On Title Page (75) Inventors, "Steven Maxwell, Synnyvale, CA (US)" should be
--Steven Maxwell, Sunnyvale, CA (US)--.

Signed and Sealed this
Seventeenth Day of September, 2013

Teresa Stanek Rea
*Deputy Director of the United States Patent and Trademark Office*